United States Patent
Onitsuka

(10) Patent No.: US 10,945,338 B2
(45) Date of Patent: Mar. 9, 2021

(54) WIRING SUBSTRATE

(71) Applicant: Kyocera Corporation, Kyoto (JP)

(72) Inventor: Yoshitomo Onitsuka, Kyoto (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 16/700,791

(22) Filed: Dec. 2, 2019

(65) Prior Publication Data
US 2020/0107448 A1     Apr. 2, 2020

Related U.S. Application Data

(62) Division of application No. 15/570,997, filed as application No. PCT/JP2017/015867 on Apr. 20, 2017, now Pat. No. 10,499,510.

(30) Foreign Application Priority Data

Apr. 22, 2016     (JP) ................. 2016-086267

(51) Int. Cl.
    *H05K 1/02*     (2006.01)
    *H05K 1/11*     (2006.01)
    (Continued)

(52) U.S. Cl.
    CPC ............ *H05K 3/0029* (2013.01); *H01L 23/13* (2013.01); *H01L 23/544* (2013.01); *H03H 3/02* (2013.01);
    (Continued)

(58) Field of Classification Search
    CPC ...... H05K 3/0029; H05K 1/0298; H05K 1/02; H05K 3/00; H05K 3/0052; H05K 1/03;
    (Continued)

(56) References Cited

U.S. PATENT DOCUMENTS 8,314,344 B2    11/2012   Sakaguchi et al.
9,215,802 B2 *  12/2015   Suzuki ................. H05K 1/0306
                          (Continued)

FOREIGN PATENT DOCUMENTS

JP    2007-318034 A    12/2007
JP    2010-272713 A    12/2010
                 (Continued)

OTHER PUBLICATIONS

International Search Report, PCT/JP2017/015867, dated Jul. 11, 2017, 2 pgs.

*Primary Examiner* — Ishwarbhai B Patel
(74) *Attorney, Agent, or Firm* — Volpe Koenig

(57) ABSTRACT

A wiring substrate includes a substrate with a first principal face and a second principal face. The first principal face has a first corner and first and second sides. The second principal face has a second corner corresponding to the first corner, and a third and a fourth side, respectively corresponding to the first and second sides. The substrate further comprising a first side surface connected to the first side, a second side surface connected to the second side, a third side surface connected to the third side, a fourth side surface connected to the fourth side, a first fracture part located between the first and third side surfaces to connect them, and a second fracture part located between the second and the fourth side surfaces to connect them. In the substrate's thickness direction, the length of the second side surface is smaller than the first side surface.

6 Claims, 8 Drawing Sheets

(51) Int. Cl.
*H05K 3/00* (2006.01)
*H01L 23/13* (2006.01)
*H01L 23/544* (2006.01)
*H03H 9/19* (2006.01)
*H03H 9/05* (2006.01)
*H03H 9/02* (2006.01)
*H03H 3/08* (2006.01)
*H03H 3/02* (2006.01)
*H01L 21/48* (2006.01)
*H03B 5/32* (2006.01)
*H05K 1/03* (2006.01)
*H01L 23/498* (2006.01)

(52) U.S. Cl.
CPC .......... *H03H 3/08* (2013.01); *H03H 9/02897* (2013.01); *H03H 9/058* (2013.01); *H03H 9/19* (2013.01); *H05K 1/02* (2013.01); *H05K 1/0298* (2013.01); *H05K 3/00* (2013.01); *H05K 3/0052* (2013.01); *H01L 21/4846* (2013.01); *H01L 23/498* (2013.01); *H03B 5/326* (2013.01); *H05K 1/0284* (2013.01); *H05K 1/03* (2013.01); *H05K 1/119* (2013.01); *H05K 2203/107* (2013.01)

(58) Field of Classification Search
CPC ................ H05K 1/0284; H05K 1/119; H05K 2203/107; H05K 2201/0909; H05K 3/4629; H01L 23/13; H01L 23/544; H01L 23/498; H01L 21/4846; H03H 9/19; H03H 9/058; H03H 9/02897; H03H 3/08; H03H 3/02; H03B 5/326
See application file for complete search history.

(56) References Cited

U.S. PATENT DOCUMENTS

| | | |
|---|---|---|
| 2009/0166895 A1 | 7/2009 | Noguchi et al. |
| 2011/0315439 A1 | 12/2011 | Nakashima |
| 2012/0222895 A1 | 9/2012 | Imamura et al. |
| 2013/0078408 A1 | 3/2013 | Niino et al. |
| 2013/0183475 A1 | 7/2013 | Yoshida et al. |
| 2015/0107879 A1 | 4/2015 | Hasegawa et al. |

FOREIGN PATENT DOCUMENTS

| | | |
|---|---|---|
| JP | 2012-081647 A | 4/2012 |
| JP | 2013-125855 A | 6/2013 |

* cited by examiner

WIRING SUBSTRATE

CROSS REFERENCE TO RELATED APPLICATION(S)

This application is a divisional of U.S. patent application Ser. No. 15/570,997, which has issued as U.S. Pat. No. 10,499,510, filed Oct. 31, 2017, which is a § 371 of International Patent Application No. PCT/JP2017/015867, filed Apr. 20, 2017, which are incorporated by reference as if fully set forth.

TECHNICAL FIELD

The present invention relates to a multi-piece wiring substrate in which a plurality of wiring substrate regions each having a mounting section for an electronic component are arranged in a matrix substrate in longitudinal and transverse directions; a wiring substrate; and a method for manufacturing a multi-piece wiring substrate.

BACKGROUND ART

In the conventional art, a multi-piece wiring substrate is known in which a plurality of wiring substrate regions are arranged in a matrix substrate in longitudinal and transverse directions. Then, dividing grooves are formed in principal faces such as an upper surface of the matrix substrate along boundaries of each wiring substrate region. When a bending stress is applied to the matrix substrate on both sides of each dividing groove, the matrix substrate is fractured and divided into individual pieces of wiring substrates. For example, the dividing grooves are formed by forming a cut in a predetermined depth by using a cutter blade or the like along an outer periphery of each wiring substrate region in the upper surface and the lower surface of the matrix substrate not yet fired. Further, in a case where a plurality of through holes are formed across the outer periphery of the wiring substrate region, by virtue of these through holes and the dividing grooves described above, the matrix substrate is relatively easily divided into individual pieces of wiring substrates. Here, in a case where an inner surface conductor is provided on the inner wall of the through hole, such a configuration can be achieved that the wiring conductors of adjacent wiring substrate regions are electrically connected together.

In recent years, individual wiring substrates are reduced in size. In association with this size reduction of wiring substrates, the width of each frame is also remarkably reduced, so that a thickness of a portion (the frame) for separating the mounting section from an external environment is remarkably reduced. In a multi-piece wiring substrate in which such wiring substrate regions whose size reduction is remarkable are arranged, for a reason of precision in mechanical processing or the like, it is difficult to provide a dividing groove along the boundary of adjacent wiring substrate regions by using a cutter blade. Thus, there is proposed a method of forming the dividing grooves by using a laser beam having excellent positional precision (see Japanese Unexamined Patent Publication JP-A 2012-81647).

Further, in this multi-piece wiring substrate, in some cases, the through holes are not formed in the outer periphery of the wiring substrate region. As such, in a case where inner conductors are provided and through holes (inner surface conductors) are not formed, in order to electrically connect together the wiring conductors of adjacent wiring substrate regions, wiring conductors for connection are provided in an inner layer in which the dividing grooves are not formed, in a thickness direction of the matrix substrate (see Japanese Unexamined Patent Publication JP-A 2007-318034).

SUMMARY OF INVENTION

Technical Problem

Nevertheless, in the multi-piece wiring substrate of the conventional art, there has been a possibility of occurrence of the following problem. That is, as for positional deviation between the dividing grooves in the upper and the lower surface, the through holes have been formed, so that a multi-piece wiring substrate less prone to be affected by the positional deviation between the dividing grooves has been obtained. Nevertheless, in a case where a wiring substrate in which through holes are not formed in the outer periphery of the wiring substrate region is to be manufactured, when a laser beam is employed in the processing of the dividing grooves, the width of the dividing groove is small in comparison with a dividing groove mechanically formed by using a die or the like in the conventional art. Thus, in comparison with a matrix substrate in which wiring substrate regions each having an outer periphery provided with through holes are arranged, a matrix substrate in which wiring substrate regions without through holes are arranged has a problem that when positional deviation or the like occurs between the dividing grooves, division becomes difficult at the corners of each wiring substrate region.

In order to resolve such a problem, it is considered that the depth of each dividing groove formed by a laser beam is made large. Nevertheless, as for the shape of the wiring substrate in recent years, further size reduction and further height reduction are required. Thus, in a case where the depth of each dividing groove is made large, possibilities have been caused that wire breakage occurs in the wiring conductor for connection serving as a conduction path between adjacent wiring substrate regions and that the matrix substrate is erroneously divided at the time of handling of the multi-piece wiring substrate.

Solution to Problem

A multi-piece wiring substrate according to an aspect of the invention includes a matrix substrate including a first principal face and a second principal face opposite to the first principal face, the matrix substrate being provided with a plurality of wiring substrate regions, the matrix substrate being provided with dividing grooves arranged along boundaries of the wiring substrate regions in the first principal face and the second principal face, the dividing grooves including first dividing grooves located along respective first sides of the wiring substrate regions in the first principal face; second dividing grooves arranged in the second principal face so as to be opposite to the first dividing grooves, respectively; third dividing grooves located along respective second sides of the wiring substrate regions in the first principal face; and fourth dividing grooves arranged in the second principal face so as to be opposite to the third dividing grooves, respectively, depths of the first dividing grooves and depths of the second dividing grooves being set to be greater than depths of the third dividing grooves and depths of the fourth dividing grooves, first curved parts being provided so that the depths of the third dividing grooves gradually increase as going toward respective corners of the wiring substrate regions, and second curved parts being provided so that the depths of the fourth dividing grooves gradually increase as going toward the respective corners of the wiring substrate regions.

A wiring substrate according to an aspect of the invention includes a substrate including a first principal face and a second principal face opposite to the first principal face and having a rectangular shape in a plan view thereof, the substrate including first side surfaces which are located along a set of opposite first sides of the first principal face, second side surfaces which are located along a set of opposite second sides of the first principal face, third side surfaces which are located along a set of opposite first sides of the second principal face, fourth side surfaces which are located along a set of opposite second sides of the second principal face, first fracture parts for connecting together the first side surfaces and the third side surfaces, respectively, and second fracture parts for connecting together the second side surfaces and the fourth side surfaces, respectively, in a thickness direction of the substrate, lengths of the first side surfaces and lengths of the third side surfaces being set to be greater than lengths of the second side surfaces and lengths of the fourth side surfaces, first curved parts being provided so that the lengths of the second side surfaces gradually increase as going toward respective corners of the substrate, and second curved parts being provided so that the lengths of the fourth side surfaces gradually increase as going toward the respective corners of the substrate.

A method for manufacturing a multi-piece wiring substrate according to an aspect of the invention includes a step of preparing a matrix substrate including a monolayer or multi-layer ceramic insulating layer, the matrix substrate including a first principal face and a second principal face opposite to the first principal face and forming a plurality of wiring substrate regions provided in the matrix substrate; a step of, by laser processing, forming first dividing grooves on a first principal face side of the matrix substrate along respective first sides of the wiring substrate regions and forming, on the first principal face side along respective second sides of the wiring substrate regions, third dividing grooves, depths of which are smaller than depths of the first dividing grooves and gradually increase as going toward respective corners of the wiring substrate regions, and thereby forming first curved parts; and a step of, by laser processing, forming second dividing grooves on a second principal face side of the matrix substrate along the respective first sides of the wiring substrate regions and forming, on the second principal face side along the respective second sides of the wiring substrate regions, fourth dividing grooves, depths of which are smaller than depths of the second dividing grooves and gradually increase as going toward the respective corners of the wiring substrate regions, and thereby forming second curved parts.

Advantageous Effects of Invention

According to the multi-piece wiring substrate according to an aspect of the invention, a multi-piece wiring substrate includes a matrix substrate including a first principal face and a second principal face opposite to the first principal face, the matrix substrate being provided with a plurality of wiring substrate regions, the matrix substrate being provided with dividing grooves arranged along boundaries of the wiring substrate regions in the first principal face and the second principal face, the dividing grooves including first dividing grooves located along respective first sides of the wiring substrate regions in the first principal face; second dividing grooves arranged in the second principal face so as to be opposite to the first dividing grooves, respectively; third dividing grooves located along respective second sides of the wiring substrate regions in the first principal face; and fourth dividing grooves arranged in the second principal face so as to be opposite to the third dividing grooves, respectively, depths of the first dividing grooves and depths of the second dividing grooves being set to be greater than depths of the third dividing grooves and depths of the fourth dividing grooves, first curved parts being provided so that the depths of the third dividing grooves gradually increase as going toward respective corners of the wiring substrate regions, and second curved parts being provided so that the depths of the fourth dividing grooves gradually increase as going toward the respective corners of the wiring substrate regions. Thus, in a multi-piece wiring substrate in which through holes are not formed in the outer periphery of the wiring substrate region, positional deviation between the dividing grooves is less prone to affect the situation even when the dividing grooves are formed by using a laser beam.

That is, in the multi-piece wiring substrate in which wiring substrate regions in which through holes are not formed are arranged, the first curved part and the second curved part are provided in the intersection parts where the dividing grooves in the longitudinal and transverse directions intersect with each other. This makes it possible to realize a multi-piece wiring substrate in which burrs and chipping in the corners of the wiring substrate can be suppressed, easy division can be satisfactorily achieved, and a wiring substrate with high dimensional precision can be manufactured.

According to the wiring substrate according to an aspect of the invention, a wiring substrate includes a substrate including a first principal face and a second principal face opposite to the first principal face and having a rectangular shape in a plan view thereof, the substrate including first side surfaces which are located along a set of opposite first sides of the first principal face, second side surfaces which are located along a set of opposite second sides of the first principal face, third side surfaces which are located along a set of opposite first sides of the second principal face, fourth side surfaces which are located along a set of opposite second sides of the second principal face, first fracture parts for connecting together the first side surfaces and the third side surfaces, respectively, and second fracture parts for connecting together the second side surfaces and the fourth side surfaces, respectively, in a thickness direction of the substrate, lengths of the first side surfaces and lengths of the third side surfaces being set to be greater than lengths of the second side surfaces and lengths of the fourth side surfaces, first curved parts being provided so that the lengths of the second side surfaces gradually increase as going toward respective corners of the substrate, and second curved parts being provided so that the lengths of the fourth side surfaces gradually increase as going toward the respective corners of the substrate. This makes it possible to realize a wiring substrate in which burrs and chipping in the corners of the wiring substrate are suppressed without the necessity of providing notches around the wiring substrate, so that a high dimensional precision is achieved.

According to the method for manufacturing a multi-piece wiring substrate according to an aspect of the invention includes a step of preparing a matrix substrate including a monolayer or multi-layer ceramic insulating layer, the matrix substrate including a first principal face and a second principal face opposite to the first principal face and forming a plurality of wiring substrate regions provided in the matrix substrate; a step of, by laser processing, forming first dividing grooves on a first principal face side of the matrix substrate along respective first sides of the wiring substrate regions and forming, on the first principal face side along respective second sides of the wiring substrate regions, the third dividing grooves, depths of which are smaller than depths of the first dividing grooves and gradually increase as going toward respective corners of the wiring substrate regions, and thereby forming the first curved parts; and a step of, by laser processing, forming the second dividing grooves on a second principal face side of the matrix substrate along the respective first sides of the wiring substrate regions and forming, on the second principal face side along the respective second sides of the wiring substrate regions, the fourth dividing groove, depths of which are smaller than depths of the second dividing grooves and gradually increase as going toward the respective corners of the wiring substrate regions, and thereby forming the second curved parts. Thus, without the necessity of providing through holes in the outer periphery of the wiring substrate, at the time when the dividing grooves are formed in the multi-piece wiring substrate by laser processing, the first curved part and the second curved part can be formed in the intersection parts where the dividing grooves in the longitudinal and transverse directions intersect with each other. Accordingly, it is possible to provide a method for manufacturing a multi-piece wiring substrate in which burrs and chipping in the corners of the wiring substrate region can be suppressed, easy division can satisfactorily be achieved, and a wiring substrate with high dimensional precision can be manufactured.

DESCRIPTION OF EMBODIMENTS

Figure 1A:
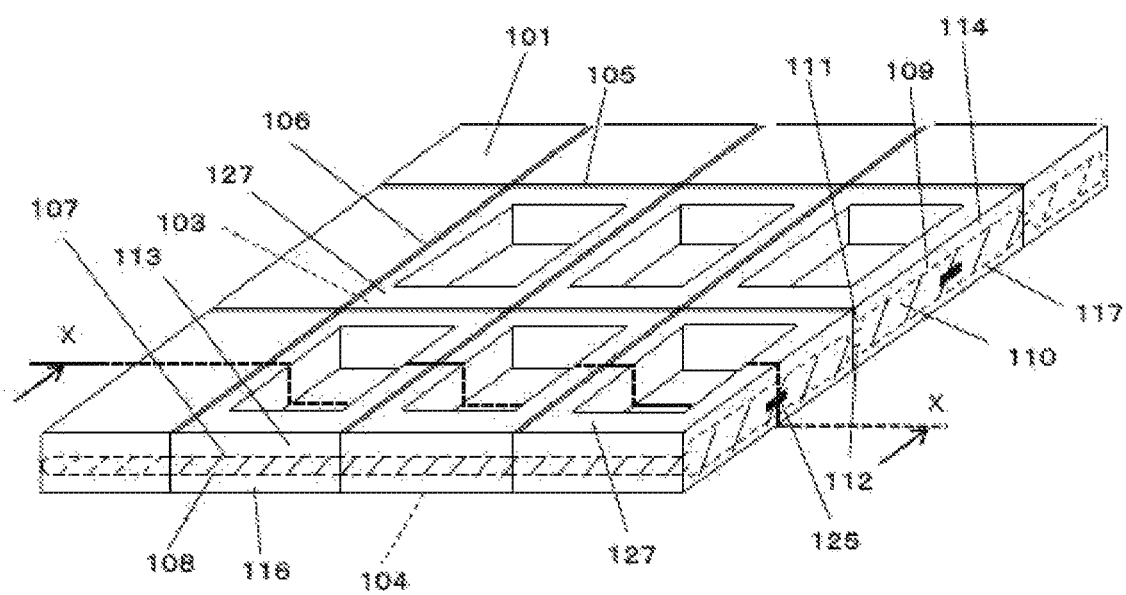
FIG. 1A is a perspective view showing a main part of a multi-piece wiring substrate according to an embodiment of the invention.

A multi-piece wiring substrate, a wiring substrate, and a method for manufacturing a multi-piece wiring substrate according to the invention are described below with reference to the accompanying drawings.

In FIGS. 1A to 8, reference numeral 101 indicates a matrix substrate, reference numeral 102 indicates a wiring substrate, reference numeral 103 indicates a first principal face, reference numeral 104 indicates a second principal face, reference numeral 105 indicates a first side, reference numeral 106 indicates a second side, reference numeral 107 indicates a first dividing groove, reference numeral 108 indicates a second dividing groove, reference numeral 109 indicates a third dividing groove, reference numeral 110 indicates a fourth dividing groove, reference numeral 111 indicates a first curved part, reference numeral 112 indicates a second curved part, reference numeral 113 indicates a first side surface, reference numeral 114 indicates a second side surface, reference numeral 115 indicates a first curved surface, reference numeral 116 indicates a third side surface, reference numeral 117 indicates a fourth side surface, reference numeral 118 indicates a second curved surface, reference numeral 119 indicates a first bottom part, reference numeral 120 indicates a second bottom part, reference numeral 121 indicates a first intersection part, reference numeral 122 indicates a second intersection part, reference numeral 123 indicates a first imaginary circle, reference numeral 124 indicates a second imaginary circle, reference numeral 125 indicates a wiring conductor for connection, reference numeral 126 indicates a laser beam, and reference numeral 127 indicates a frame-shaped metallized layer.

Each wiring substrate 102 which is arranged in the matrix substrate 101 and is to be an electronic component housing package has the first principal face 103 including a recess-shaped mounting section. Then, an electronic component (not illustrated) is housed in this mounting section. The wiring substrate 102 includes a base and a frame stacked on the base. The frame-shaped metallized layer 127 is provided on the frame in the first principal face 103 and then a metallic frame body (not illustrated) and a metallic lid member (not illustrated) are joined to the frame-shaped metallized layer 127 by using a brazing material. Here, in a case where the metallic frame body is joined to the frame-shaped metallized layer 127, such a configuration is employed that the metallic lid member is further joined to the metallic frame body. Further, the wiring substrate 102 includes wiring conductors, wiring conductors for connection, external connection conductors, and the like. Further, an electronic component is joined by using a joining material or the like to the wiring conductors provided in the mounting section of the wiring substrate 102, so that an electronic device is formed.

Figure 1B:
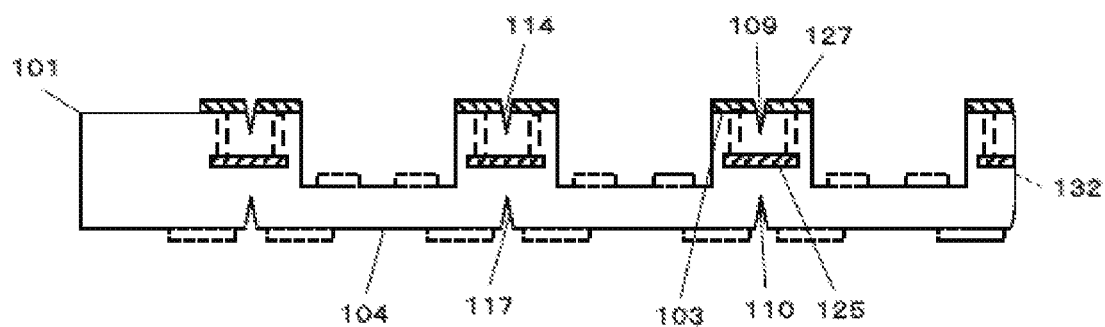
FIG. 1B is a cross-sectional view taken along the line of X-X of FIG. 1A.

In general, such a wiring substrate 102 is manufactured in the form of a so-called multi-piece wiring substrate in which a plurality of wiring substrates 102 are simultaneously and collectively obtained from a single substrate of the matrix substrate 101 having a large area. For example, in the multi-piece wiring substrate, a plurality of wiring substrate regions are arranged in longitudinal and transverse directions on the matrix substrate 101 formed of an aluminum oxide sintered body. As shown in FIGS. 1A and 1B, in the matrix substrate 101, wiring substrate regions (regions each constituting the wiring substrate 102) each having an outer periphery not provided with through holes are arranged. Since through holes are not provided in the outer periphery of the wiring substrate region and an inner surface conductor on the inner surface of the through hole is not provided, in order to electrically connect together the wiring conductors of adjacent wiring substrate regions, the wiring conductor 125 for connection is provided in an inner layer in the thickness direction of the matrix substrate 101 in which dividing grooves are not formed. FIGS. 1A and 1B show a structure provided in the vicinity of the center of the thickness on the long side of each wiring substrate region. Here, the position of formation of the wiring conductor 125 for connection may be located on the short side of each wiring substrate region. This wiring conductor 125 for connection allows wiring conductors (not illustrated), the wiring conductors 125 for connection, external connection conductors (not illustrated), and the like in adjacent wiring substrate regions to be connected together, so that the individual wiring conductors of the matrix substrate 101 are connected in an integrated manner. Then, for example, the wiring conductor 125 for connection is led out to a conductor for plating (not illustrated) provided in a notch in a margin region of the matrix substrate 101 and then electricity is supplied through the conductor for plating, so that electroplating is performed on the wiring substrate 102 and the like.

For example, the matrix substrate 101 is formed of a ceramic sintered body such as an aluminum oxide sintered body, a glass ceramic sintered body, an aluminum nitride sintered body, a silicon carbide sintered body, a silicon nitride sintered body, and a mullite sintered body.

The matrix substrate 101 is manufactured by laminating a plurality of ceramic insulating layers and then integrally firing the stacked body. That is, in a case where the matrix substrate 101 is formed of an aluminum oxide sintered body, the matrix substrate 101 is manufactured as follows. First, a suitable organic solvent and a suitable binder are added to raw material powder containing glass components such as aluminum oxide and silicon oxide and then these materials are formed into a sheet to prepare a plurality of ceramic green sheets. After that, punching is performed on part of these sheets so that ceramic green sheets each provided with a plurality of frames are obtained. Then, the ceramic green sheets provided with the plurality of frames are laminated on the flat-plate shaped ceramic green sheets not having undergone punching. After that, the stacked body is integrally fired, so that it is possible to manufacture the matrix substrate 101 which is constituted by a stack of a plurality of ceramic insulating layers and in which wiring substrate regions are formed and arranged in longitudinal and transverse directions. In this case, the ceramic green sheets having undergone punching constitute the frame, and the ceramic green sheets not having undergone punching constitute the base.

The wiring substrate 102 serving as an electronic component housing package includes a mounting section (a recess-shaped portion) for electronic component provided in the center part of the upper surface. The base and the frame serve as a container for protecting the electronic component housed in the mounting section. The electronic component housed in the mounting section may be an electronic component of diverse kind like: a piezoelectric oscillator such as a quartz oscillator; a surface acoustic wave device; a semiconductor device such as a semiconductor integrated circuit (IC); a capacitance device; an inductor device; and a resistor.

For example, in a case where the electronic component is a quartz oscillator and the electronic device is a quartz device, the electronic component housing package of such a form is used as a package for oscillator for providing a frequency standard and a time standard in an electronic apparatus like a communication apparatus such as a portable phone and a smartphone and like an information apparatus such as a computer and an IC card. Further, the electronic device in this case is used as an oscillator. For example, the electronic component housed in the mounting section is electrically connected to the wiring conductors by using a joining material such as electroconductive adhesives.

Figure 2A:
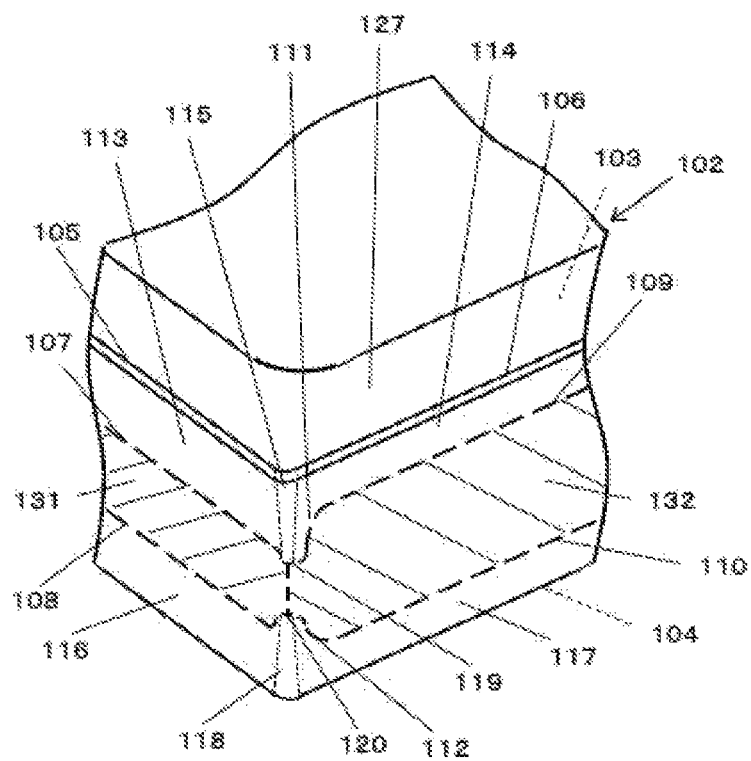
FIG. 2A is an enlarged perspective view showing a main part of a wiring substrate according to an embodiment of the invention.
Figure 2B:
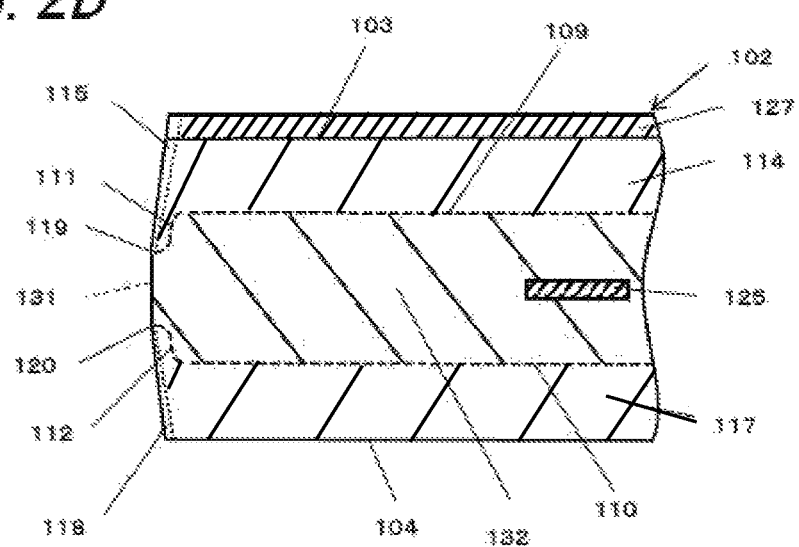
FIG. 2B is a cross-sectional view of FIG. 2A.

The wiring substrate 102 is obtained by dividing into individual pieces a matrix substrate manufactured in so-called multi-piece form. For example, a plurality of wiring substrate regions each having a mounting section are arranged in longitudinal and transverse directions on the matrix substrate 101 composed of a stack of a plurality of ceramic insulating layers. Then, dividing grooves are formed by using a laser beam along the boundaries of the wiring substrate region in the upper surface of the matrix substrate 101, so that a basic configuration of the multi-piece wiring substrate is obtained as shown in FIG. 1 or the like. Then, the matrix substrate 101 having such a configuration is divided along the boundaries of the wiring substrate region, so that the wiring substrate 102 which is to be the electronic component housing package as shown in FIGS. 2A and 2B or the like is manufactured.

For the purpose of dividing the matrix substrate 101, dividing grooves are formed along the boundaries of the wiring substrate region in the first principal face 103 and the second principal face 104 of the matrix substrate 101. The first dividing groove 107 and the third dividing groove 109 are formed in the first principal face 103, and the second dividing groove 108 and the fourth dividing groove 110 are formed in the second principal face 104. Then, when a stress is applied to the matrix substrate 101 in a portion thereof in which both dividing grooves are formed (a boundary of the wiring substrate region) so that the matrix substrate 101 is bent in the thickness direction, the matrix substrate 101 is divided into individual pieces of the wiring substrates 102.

In the inside and the surface of the wiring substrate 102, wiring conductors (not illustrated) are formed from the bottom surface or the like of the mounting section toward the lower surface of the wiring substrate 102. Among these wiring conductors, for example, a portion formed in the second principal face of the wiring substrate 102 is external connection conductors. Among the wiring conductors, those formed in the inside of the wiring substrate 102 are through conductors (so-called via conductors or the like), wiring conductors 125 for connection, and the like. When the electronic component mounted on the mounting section is electrically connected to the wiring conductors, the electronic component is electrically connected through the wiring conductors and the external connection conductors to an external electric circuit (not illustrated).

For example, the wiring conductor is formed of a metallic material such as copper, silver, palladium, gold, platinum, tungsten, molybdenum, and manganese or from an alloy containing these materials. For example, in a case where the wiring conductor is formed of molybdenum serving as a high melting point metal, the wiring conductor can be formed by adding an organic solvent and a binder to molybdenum powder so that metal paste (not illustrated) is prepared; coating the obtained metal paste in a predetermined pattern onto a ceramic green sheet constituting the wiring substrate 102; and then performing cofiring process.

In the multi-piece wiring substrate described above, a metallized conductor layer constituting the frame-shaped metallized layer 127 of the wiring substrate 102 posterior to dividing is formed in the outer periphery part of the upper surface of each wiring substrate region. For example, the outer periphery of the frame-shaped metallized layer 127 is in contact with the first dividing groove 107 and the third dividing groove 109. For example, the frame-shaped metallized layer 127 is formed of a metal such as tungsten and molybdenum. For example, in a case where the frame-shaped metallized layer 127 is composed of a metallized conductor layer of molybdenum, the frame-shaped metallized layer 127 can be formed by adding an organic solvent, a binder, and the like to molybdenum powder to prepare metal paste; and then printing the obtained metal paste in a predetermined pattern onto the upper surface of a ceramic green sheet constituting the ceramic insulating layer (the frame). For example, the metal paste is formed by screen printing or otherwise so that the thickness of the frame-shaped metallized layer 127 after firing becomes about 8 to 20 μm.

Further, in some cases, a metallic frame body (not illustrated) is further joined onto the upper surface of the frame-shaped metallized layer 127 by using a brazing material. The joining of the metallic frame body may be performed in the state of multi-piece wiring substrate or, alternatively, may be performed in the state of individual piece of the electronic component housing package (the wiring substrate 102). When productivity is taken into consideration, the above-mentioned joining is performed in the state of multiple patterning. Then, the metallic lid member is joined to the metallic frame body and then the electronic component is sealed in the mounting section. In an example of the present embodiment, plating layers (not illustrated) such as a nickel plating layer and a gold plating layer are successively plated on the exposed surfaces of the frame-shaped metallized layer 127 and the metallic frame body. Here, for example, the nickel plating layer is formed in about 1.0 to 20 μm and the gold plating layer is formed in about 0.1 to 1.0 μm. Since these plating layers cover the surfaces of the exposed metal layers, corrosion protection of the metal layers and wettability to a solder, a brazing material, or the like become satisfactory.

The multi-piece wiring substrate includes the matrix substrate 101 including the first principal face 103 and the second principal face 104 opposite to the first principal face 103 and is provided with a plurality of wiring substrate regions (regions each constituting the wiring substrate 102). The matrix substrate 101 is provided with dividing grooves arranged along boundaries of the wiring substrate regions in the first principal face 103 and the second principal face 104. The dividing grooves includes the first dividing grooves 107 located along the respective first sides 105 of the wiring substrate regions in the first principal face 103; the second dividing grooves 108 arranged in the second principal face 104 so as to be opposite to the first dividing grooves 107, respectively; the third dividing grooves 109 located along the respective second sides 106 of the wiring substrate regions in the first principal face 103; and the fourth dividing grooves 110 arranged in the second principal face 104 so as to be opposite to the third dividing grooves 109. The depths of the first dividing grooves 107 and the depths of the second dividing grooves 108 are set to be greater than the depths of the third dividing grooves 109 and the depths of the fourth dividing grooves 110. The first curved parts 111 are provided so that the depths of the third dividing grooves 109 gradually increase as going toward respective corners of the wiring substrate regions, and the second curved parts 112 are provided so that the depths of the fourth dividing grooves 110 gradually increase as going toward the respective corners of the wiring substrate regions.

By virtue of this configuration, in a multi-piece wiring substrate in which through holes are not formed in the outer periphery of the wiring substrate region, positional deviation between the dividing grooves is less prone to affect the situation even when the dividing grooves are formed by using the laser beam 126.

That is, in the multi-piece wiring substrate in which wiring substrate regions in which through holes are not formed are arranged, the first curved part 111 and the second curved part 112 are provided in the intersection parts where the dividing grooves in the longitudinal and transverse directions intersect with each other. This makes it possible to realize a multi-piece wiring substrate in which burrs and chipping in the corners of the wiring substrate can be suppressed, easy division can satisfactorily be achieved, and the wiring substrate 102 with high dimensional precision can be manufactured.

Specifically, in the matrix substrate 101, the first dividing groove 107 arranged in the first principal face 103 of the first side 105 and the second dividing groove 108 arranged in the second principal face 104 are formed opposite to each other in a relatively large depth. Thus, easy division can satisfactorily be achieved along the first side 105 of the matrix substrate 101. Further, in the matrix substrate 101, the third dividing groove 109 arranged in the first principal face 103 of the second side 106 and the fourth dividing groove 110 arranged in the second principal face 104 are formed opposite to each other in a relatively shallow depth. Thus, easy division is suppressed in the direction along the second side 106 of the matrix substrate 101. However, since the first curved part 111 and the second curved part 112 are provided as described above, the property of easy division in the corner in each wiring substrate 102 can be improved.

In a multi-piece wiring substrate (not illustrated) in which through holes are formed in the outer periphery of the wiring substrate region like in the conventional art, as for positional deviation between the dividing grooves in the upper and the lower surface, since through holes are formed, such a structure can be realized that positional deviation between the dividing grooves is less prone to affect the situation. Nevertheless, in a case where the wiring substrate 102 in which through holes are not formed in the outer periphery of the wiring substrate region is to be manufactured, when processing of the dividing grooves by using a laser beam is employed, the width of the dividing groove is small in comparison with a dividing groove mechanically formed by using a die or the like in the conventional art. Thus, when positional deviation or the like occurs between the dividing grooves, there has been caused a possibility that dividing in the corner of the wiring substrate region becomes difficult. However, when the first curved part 111 and the second curved part 112 are provided as described above, the substantial fracture area along the second side 106 becomes small. Further, in the wiring substrate region, in the corner where burrs and chipping easily occur, the third dividing groove 109 and the fourth dividing groove 110 formed in a relatively shallow depth have such a configuration that the dividing groove in the vicinity of the corner of the wiring substrate region is formed in a large depth. Thus, for example, even when a stress acts on the multi-piece wiring substrate at the time of handling or the like, erroneous division is suppressed and the property of easy division in the corner in each wiring substrate 102 can be improved.

Further, as shown in FIGS. 1A and 1B, in a case where the wiring conductor 125 for connection is provided in the inner layer of the second side 106 of the wiring substrate region, even when the size of the wiring substrate 102 is reduced so that the thickness becomes extremely thin, the third dividing groove 109 arranged in the first principal face 103 of the second side 106 and the fourth dividing groove 110 arranged in the second principal face 104 are formed in a relatively shallow depth and hence there is reduced a possibility that the formation of the dividing grooves causes wire breakage in the wiring conductor 125 for connection. Thus, there are effects that wire breakage is suppressed in the wiring conductor 125 for connection serving as a conduction path between adjacent wiring substrate regions and that erroneous division of the matrix substrate 101 caused by a stress at the time of handling or the like can be suppressed. As for a procedure of dividing the matrix substrate 101 into individual pieces, first, the matrix substrate 101 may be divided along each first side 105 in which the first dividing groove 107 and the second dividing groove 108 are formed, into the form of strips, that is, into arrays in each of which the wiring substrate regions are arranged in line. Then, each strip-shaped array may be divided into individual pieces of the wiring substrates 102 along each of the second sides 106 in which the third dividing groove 109 and the fourth dividing groove 110 are formed. By virtue of this division method, in division of the matrix substrate 101 along the first side 105, the depth of each dividing groove becomes relatively deep and hence the fracture area in the entire matrix substrate 101 can be made large. Further, in division of the strip-shaped array along the second side 106, the depth of each dividing groove becomes relatively shallow but the width of the array to be divided can be reduced and hence the fracture area can be made small. Thus, in a state where easy division of the matrix substrate 101 can satisfactorily be achieved, there are effects that erroneous division caused by a stress at the time of handling or the like can be suppressed and that wire breakage can be suppressed in the wiring conductor 125 for connection. Here, a detailed manufacturing method for each dividing groove will be described later.

Further, in the multi-piece wiring substrate, on the first principal face 103 side, the first curved surface 115 is provided between the first side surface 113 exposed along the first side 105 of the wiring substrate region and the second side surface 114 exposed along the second side 106. Furthermore, on the second principal face 104 side, the second curved surface 118 is provided between the third side surface 116 exposed along the first side 105 of the wiring substrate region and the fourth side surface 117 exposed along the second side 106. Then, the first curved surface 115 and the second curved surface 118 individually have a width gradually decreasing as going toward a center part of the multi-piece wiring substrate in a thickness direction thereof in the wiring substrate region.

By virtue of this configuration, the first curved surface 115 is provided on the first principal face 103 side of each corner of the wiring substrate 102 formed in an individual piece. Further, the second curved surface 118 is provided on the second principal face 104 side. This makes it possible to realize a multi-piece wiring substrate in which burrs and chipping in the corners can be suppressed, easy division can satisfactorily be achieved, and the wiring substrate 102 with high dimensional precision can be manufactured.

Further, for example, storability at the time of storing into a tray (a container for conveyance provided with a plurality of recesses) or the like for conveying the wiring substrate 102 becomes satisfactory. Employable materials for the tray include a resin such as PE (polyethylene) and PP (polypropylene) and hence the tray is formed of a softer material compared with the ceramic material constituting the wiring substrate 102.

In a multi-piece wiring substrate (not illustrated) in which through holes are formed in the outer periphery of the wiring substrate region like in the conventional art, a notch having a quarter-circle arc shape is provided in each corner of the wiring substrate (not illustrated) formed in an individual piece and hence such a configuration is realized that the four corners of the wiring substrate are chamfered by these notches. Thus, at the time of storing into the tray or the like for conveying the wiring substrate, the wiring substrate has been stored relatively easily. In contrast, in the four corners of the wiring substrate 102 obtained from the multi-piece wiring substrate in which through holes are not provided in the four corners of the wiring substrate region as described above, at the time when dividing grooves are formed in the matrix substrate 101 constituting the multi-piece wiring substrate, the dividing grooves are formed along the boundaries of the wiring substrate region by using the laser beam 126 and then the first curved surface 115 and the second curved surface 118 are provided in the four corners of the wiring substrate 102 formed in an individual piece. By virtue of this, burrs and chipping in the corners can be suppressed and storability at the time of storing into the tray or the like becomes satisfactory.

As such, in order to provide the first curved surface 115 in the four corners of the wiring substrate region constituting the wiring substrate 102, for example, as described above, the first dividing groove 107 may be located along the first side 105 on the first principal face 103 side by using the laser beam 126 and, further, the third dividing groove 109 may be provided so that the first dividing groove 107 and the third dividing groove 109 intersect with each other at the position of a corner of each wiring substrate region. At the time of providing the third dividing groove 109, as shown in FIGS. 2A and 2B, at the position of a corner of each wiring substrate region, the laser beam 126 is projected on the corner of each wiring substrate region so that chamfering is performed and thereby the first curved surface 115 is provided. Further, the second dividing groove 108 may be located along the first side 105 on the second principal face 104 side by using the laser beam 126 and, further, the fourth dividing groove 110 may be provided so that the second dividing groove 108 and the fourth dividing groove 110 intersect with each other at the position of a corner of each wiring substrate region. At the time of providing the fourth dividing groove 110, as shown in FIGS. 2A and 2B, at the position of a corner of each wiring substrate region, the laser beam 126 is projected on the corner of each wiring substrate region so that chamfering is performed and thereby the second curved surface 118 is provided.

Here, the laser beam 126 is projected onto the matrix substrate 101 in a vertical direction from up to down and projected so that the focal point may be located in the vicinity of the lowest point of the dividing groove. That is, each dividing groove has a vertical cross section of V-shape or U-shape. Thus, as shown in FIGS. 2A and 2B, the width of the first curved surface 115 increases as going closer to the first principal face 103 of the wiring substrate region, and the width of the second curved surface 118 increases as going closer to the second principal face 104 of the wiring substrate region. By virtue of this, in each wiring substrate 102 obtained by dividing the matrix substrate 101 into individual pieces, in both the first principal face 103 side (the upper surface) and the second principal face 104 side (the lower surface) of the wiring substrate 102, the corner in the vicinity of each principal face of the wiring substrate 102 is chamfered by the laser beam 126 and hence has a large curvature so that each corner of the wiring substrate 102 is less prone to constitute a sharp edge. Thus, at the time when the wiring substrate 102 is stored into a tray for conveyance or the like, each corner of the wiring substrate 102 is less prone to be caught on the inner side surface of the tray or the like even in a case where the tray is formed of a soft material. This provides more effectively satisfactory storability at the time of storing the wiring substrate 102 into the tray for conveying or the like. Further, generation of dusts can be suppressed that is caused when each corner of the wiring substrate 102 goes into contact with the inner side surface of the tray at the time of conveyance so that a part of the tray is scraped.

Further, in the multi-piece wiring substrate, the first bottom part 119 is provided in a region where the first dividing groove 107 and the third dividing groove 109 intersect with each other. Further, in a transparent plan view, the first bottom part 119 is located within the first imaginary circle 123 whose center is located in the first intersection part 121 where the second dividing groove 108 and the fourth dividing groove 110 intersect with each other and whose radius is equal to a length between the first intersection part 121 and one end part of the second curved part 112 where the depth of the fourth dividing groove 110 is smallest. Furthermore, the second bottom part 120 is provided in a region where the second dividing groove 108 and the fourth dividing groove 110 intersect with each other. Further, in a transparent plan view, the second bottom part 120 is located within the second imaginary circle 124 whose center is located in a second intersection part 122 where the first dividing groove 107 and the third dividing groove 109 intersect with each other and whose radius is equal to a length between the second intersection part 122 and one end part of the first curved part 111 where the depth of the third dividing groove 109 is smallest.

By virtue of this configuration, at the time when the matrix substrate 101 constituting a multi-piece wiring substrate is divided into individual pieces so that the wiring substrate 102 is manufactured, burrs and chipping easily caused in each corner of the wiring substrate 102 by positional deviation between the dividing grooves in the upper and the lower surface can be suppressed more effectively. That is, when the matrix substrate 101 is bent along the first side 105 from the first dividing groove 107 located on the first principal face 103 side toward the second dividing groove 108 provided on the second principal face 104 side so as to be opposite to the first dividing groove 107 so that the matrix substrate 101 is divided, a fracture part is generated along the first side 105 from the bottom part of the first dividing groove 107 toward the bottom part of the second dividing groove 108. Further, in each corner of the wiring substrate region, a fracture part is generated from the first bottom part 119 which is positioned deeper than the bottom part of the first dividing groove 107 toward the second bottom part 120 which is positioned deeper than the bottom part of the second dividing groove 108. At that time, the surfaces of the first bottom part 119 and the second bottom part 120 have curved surfaces along the first curved surface 115 and the second curved surface 118. Thus, even in a case where positional deviation occurs between the dividing grooves in the upper and the lower surface, these curved surfaces have an effect of alleviating the positional deviation between the dividing grooves.

Figure 3:
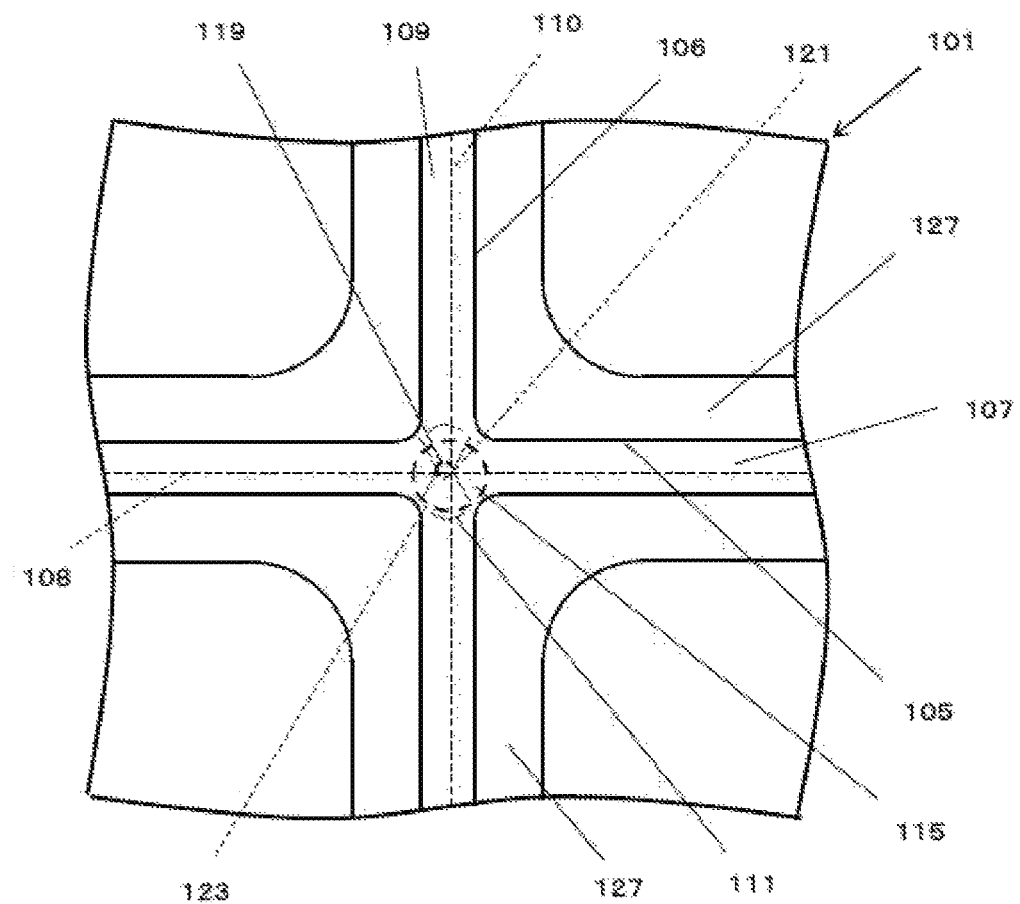
FIG. 3 is a transparent top view showing a main part of the multi-piece wiring substrate according to the embodiment of the invention.
Figure 4:
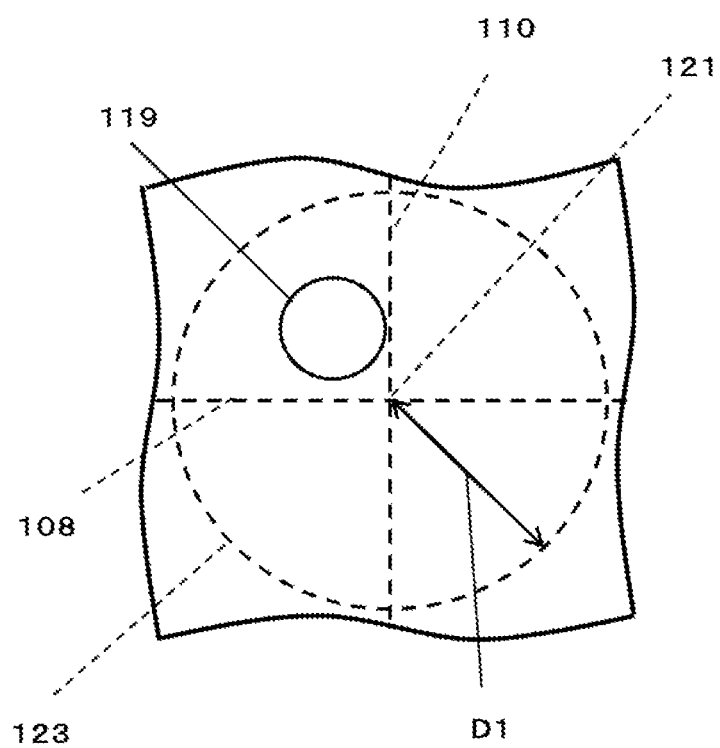
FIG. 4 is a transparent top view showing the positions of dividing grooves formed in a first principal face and dividing grooves formed in a second principal face in a multi-piece wiring substrate according to the embodiment of the invention.

FIG. 3 is a transparent top view showing a main part of the multi-piece wiring substrate according to an embodiment of the invention. FIG. 4 is a transparent top view showing the positional relationship of the second dividing groove 108 and the fourth dividing groove 110 provided in the second principal face 104, relative to the first bottom part 119 provided in the first principal face 103. Here, the example shown in FIGS. 3 and 4 indicate bottom parts of the second dividing groove 108 and the fourth dividing groove 110. In FIG. 4, D1 denotes a distance between the center of the first intersection part 121 and a point where the second curved part 112 begins to curve. In this figure, the first bottom part 119 is provided at a point (the second intersection part 122) where the first dividing groove 107 and the third dividing groove 109 located on the first principal face 103 side intersect with each other. FIG. 3 shows a situation where in a transparent plan view, the position of the second dividing groove 108 located on the second principal face 104 side is deviated downward relative to the first bottom part 119 and the position of the fourth dividing groove 110 is deviated rightward. In this example, in the transparent plan view, the second curved part 112 is located along the fourth dividing groove 110 in the vicinity of the first bottom part 119. Thus, at the time when a fracture part is generated from the first dividing groove 107 located on the first principal face 103 side toward the second dividing groove 108 located on the second principal face 104 side, the fracture part is generated from the first bottom part 119 toward a curved surface along the second curved part 112 in the vicinity of the second bottom part 120. Accordingly, in each corner of the wiring substrate 102, the fracture part is less prone to be generated in a portion distant from the second bottom part 120. Thus, burrs and chipping are effectively suppressed in each corner of the wiring substrate.

Figure 5:
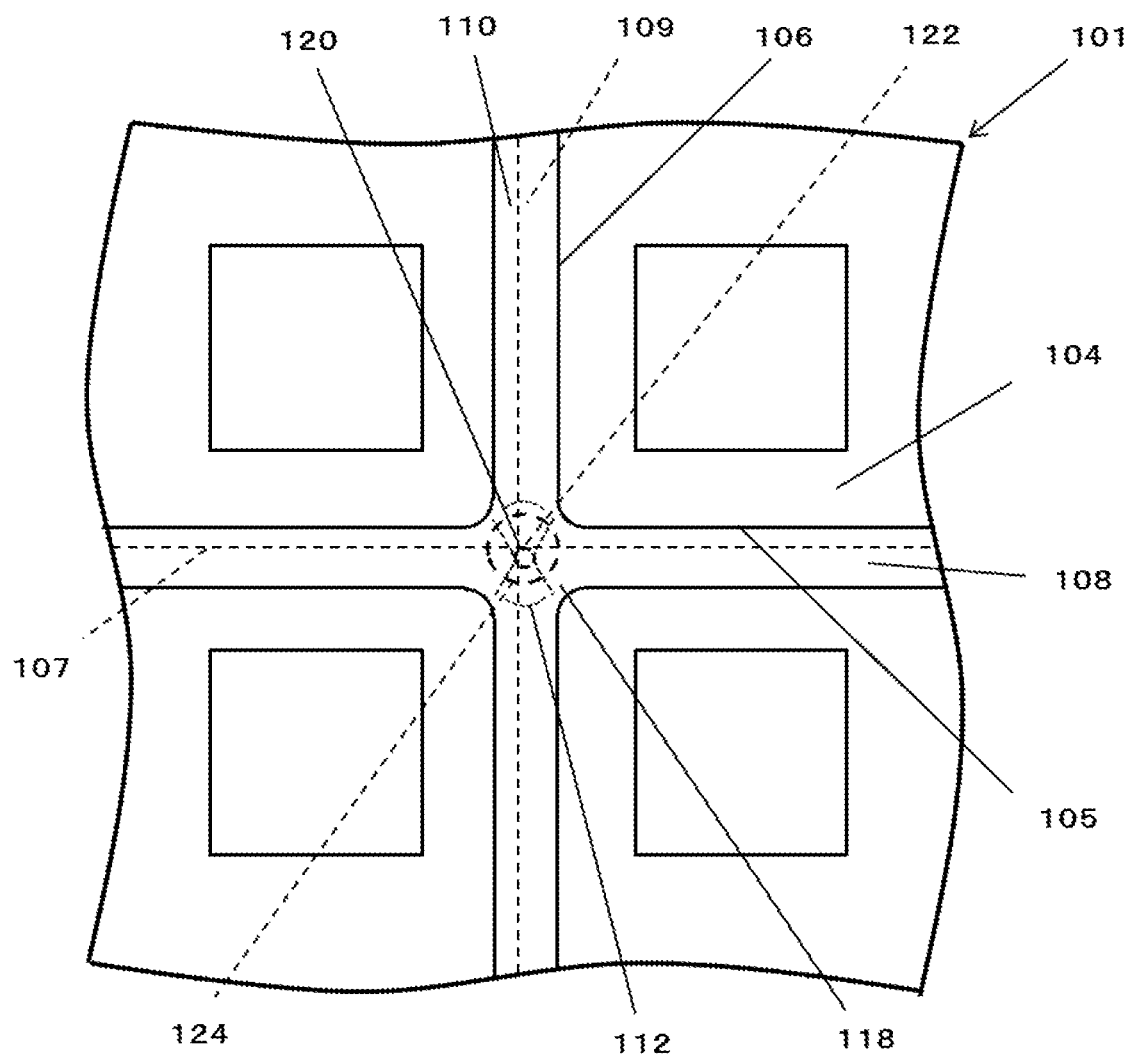
FIG. 5 is a transparent bottom view showing a main part of the multi-piece wiring substrate according to the embodiment of the invention.
Figure 6:
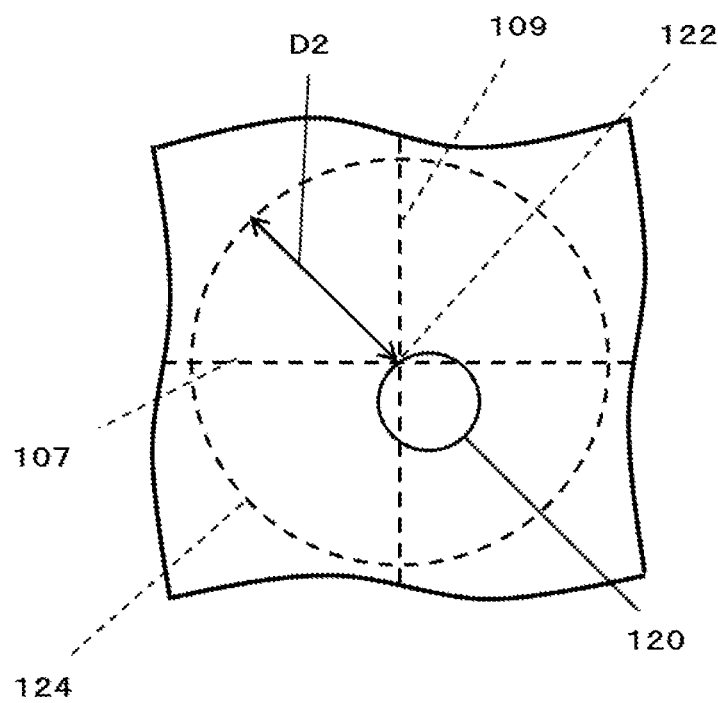
FIG. 6 is a transparent bottom view showing the positions of dividing grooves formed in the second principal face and dividing grooves formed in the first principal face in the multi-piece wiring substrate according to the embodiment of the invention.

Further, FIG. 5 is a transparent bottom view showing a main part of the multi-piece wiring substrate according to an embodiment of the invention. FIG. 6 is a transparent bottom view showing the positional relationship of the first dividing groove 107 and the third dividing groove 109 provided in the first principal face 103, relative to the second bottom part 120 provided in the second principal face 104. Here, the example shown in FIGS. 5 and 6 indicate bottom parts of the first dividing groove 107 and the third dividing groove 109. In FIG. 6, D2 indicates a distance between the center of the second intersection part 122 and a point where the first curved part 111 begins to curve. In this figure, the second bottom part 120 is provided at a point (the first intersection part 121) where the second dividing groove 108 and the fourth dividing groove 110 located on the second principal face 104 side intersect with each other. FIG. 5 shows a situation where in a transparent plan view, the position of the first dividing groove 107 located on the first principal face 103 side is deviated upward relative to the second bottom part 120 and the position of the third dividing groove 109 is deviated leftward. In this example, in the transparent plan view, the first curved part 111 is located along the second dividing groove 108 in the vicinity of the second bottom part 120. Thus, at the time when a fracture part is generated from the second dividing groove 108 located on the second principal face 104 side toward the first dividing groove 107 located on the first principal face 103 side, the fracture part is generated from the second bottom part 120 toward a curved surface along the first curved surface 115 in the vicinity of the first bottom part 119. Accordingly, in each corner of the wiring substrate, the fracture part is less prone to be generated in a portion distant from the first bottom part 119. Thus, burrs and chipping are effectively suppressed in each corner of the wiring substrate.

The wiring substrate 102 according to an embodiment of the invention includes a substrate including the first principal face 103 and the second principal face 104 opposite to the first principal face 103 and having a rectangular shape in a plan view thereof, the substrate including the first side surfaces 113 which are located along a set of opposite first sides 105 of the first principal face 103; the second side surfaces 114 which are located along a set of opposite second sides 106 of the first principal face 103; the third side surfaces 116 which are located along a set of opposite first sides 105 of the second principal face 104; and the fourth side surfaces 117 which are located along a set of opposite second sides 106 of the second principal face 104; first fracture parts 131 for connecting together the first side surfaces 113 and the third side surfaces 116, respectively; and second fracture parts 132 for connecting together the second side surfaces 114 and the fourth side surfaces 117, respectively, in the thickness direction of the substrate, lengths of the first side surfaces 113 and lengths of the third side surfaces 116 being set to be greater than lengths of the second side surfaces 114 and lengths of the fourth side surfaces 117, and the first curved parts 111 being provided so that the lengths of the second side surfaces 114 gradually increase as going toward respective corners of the substrate, and the second curved parts 112 being provided so that the lengths of the fourth side surfaces 117 gradually increase as going toward respective corners of the substrate.

By virtue of this configuration, the wiring substrate 102 can be realized in which burrs and chipping in the corners of the wiring substrate are suppressed without the necessity of providing notches around the wiring substrate 102 so that a high dimensional precision is achieved. That is, even when such a notch is not provided in each corner of the wiring substrate 102, the first curved part 111 and the second curved part 112 are formed in each corner so that such a structure can be realized that the four corners of the wiring substrate 102 are chamfered. This makes it possible to realize the wiring substrate 102 with high dimensional precision in which chipping in the wiring substrate 102 at the time of conveyance is suppressed.

FIG. 2A shows a main part enlarged view of the wiring substrate 102 having the above-mentioned configuration. This figure is a perspective view of a corner of the wiring substrate 102 viewed obliquely from above. Along the first side 105 of the wiring substrate 102, the first side surface 113 and the third side surface 116 are provided by the first dividing groove 107 arranged in the first principal face 103 and by the second dividing groove 108 arranged in the second principal face 104 so as to be opposite to the first dividing groove 107. Further, there is provided the first fracture part 131 which connects together the first side surface 113 and the third side surface 116. Further, along the second side 106 of the wiring substrate 102, the second side surface 114 and the fourth side surface 117 are provided by the third dividing groove 109 arranged in the first principal face 103 and by the fourth dividing groove 110 arranged in the second principal face 104 so as to be opposite to the third dividing groove 109. Further, there is provided the second fracture part 132 which connects together the second side surface 114 and the fourth side surface 117. In a plan view, the first fracture part 131 and the second fracture part 132 are located in the outermost periphery of the wiring substrate 102 and formed as vertical surfaces. Thus, the first fracture part 131 and the second fracture part 132 can effectively be utilized as reference surfaces for positioning at the time when the electronic component is housed into the wiring substrate 102. Here, in comparison with the first fracture part 131, the second fracture part 132 has a larger width in the thickness direction of the wiring substrate. Thus, the second fracture part 132 serves more effectively as the reference surface for positioning of the wiring substrate 102.

Further, along the second side 106 of each corner of the wiring substrate 102, the first curved part 111 is provided so that the length of the second side surface 114 gradually increases as going toward the corner, and the second curved part 112 is provided so that the length of the fourth side surface 117 gradually increases as going toward the corner. Then, the first curved surface 115 is located on the first principal face 103 side of each corner of the wiring substrate 102 and, further, the second curved surface 118 is located on the second principal face 104 side. That is, such a configuration is realized that in the thickness direction of the wiring substrate 102, the four corners of the wiring substrate 102 are chamfered except for a portion between the first bottom part 119 on the first principal face 103 side and the second bottom part 120 on the second principal face 104 side. Thus, at the time when the matrix substrate 101 is divided into individual pieces, the region actually fractured in each corner of the wiring substrate 102 is made minimal. This makes it possible to realize the wiring substrate 102 with high dimensional precision in which chipping in the wiring substrate 102 at the time of conveyance is suppressed. Here, as shown in FIGS. 2A and 2B, each of the first curved part 111 and the second curved part 112 curves in a shape concave toward the second fracture surface 132 side as going toward the corner. Further, in the vicinity of each of the first bottom part 119 and the second bottom part 120, each of the first curved part 111 and the second curved part 112 curves in a shape convex toward the second fracture surface 132 side. Further, in the first bottom part 119 and the second bottom part 120, each principal face has a curved part. Thus, strictly speaking, a small curved part (not illustrated) is provided from the bottom part of the first dividing groove 107 toward the first bottom part 119 of the corner and a small curved part (not illustrated) is provided from the bottom part of the second dividing groove 108 toward the second bottom part 120 of the corner.

Further, also when the first fracture part 131 and the second fracture part 132 are used as reference surfaces for positioning at the time of housing the electronic component into the wiring substrate 102, in a plan view of the wiring substrate 102, the first curved surface 115 and the second curved surface 118 in each corner of the wiring substrate 102 are located on the inner side of the first fracture part 131 and the second fracture part 132. Thus, this configuration permits more satisfactory positioning of the wiring substrate 102. Thus, it is possible to provide the wiring substrate 102 in which chipping in the wiring substrate 102 is suppressed, a high dimensional precision is obtained, and an excellent positioning precision is achieved.

The method for manufacturing a multi-piece wiring substrate according to an embodiment of the invention includes a step of preparing the matrix substrate 101 including a monolayer or multi-layer ceramic insulating layer (not illustrated), the matrix substrate having the first principal face 103 and the second principal face 104 opposite to the first principal face 103 and forming a plurality of the wiring substrate regions provided in the matrix substrate 101; a step of, by laser processing, forming the first dividing grooves 107 on the first principal face 103 side of the matrix substrate 101 along the respective first sides 105 of the wiring substrate regions and forming, on the first principal face 103 side along the respective second sides 106 of the wiring substrate regions, the third dividing groove 109, depths of which are smaller than depths of the first dividing grooves 107 and gradually increase as going toward respective corners of the wiring substrate regions, and thereby forming the first curved parts 111; and a step of, by laser processing, forming the second dividing grooves 108 on the second principal face 104 side of the matrix substrate 101 along the respective first sides 105 of the wiring substrate regions and forming, on the second principal face 104 side along the respective second sides 106 of the wiring substrate regions, the fourth dividing grooves 110, depths of which are smaller than depths of the second dividing grooves 108 and gradually increase as going toward the respective corners of the wiring substrate region, and thereby forming the second curved parts 112.

By virtue of this manufacturing method, even in a case where through holes are not provided in the outer periphery of the wiring substrate 102, at the time when the dividing grooves are formed in the multi-piece wiring substrate by laser processing, the first curved part 111 and the second curved part 112 can be formed in the intersection parts where the dividing grooves in the longitudinal and transverse directions intersect with each other. Accordingly, it is possible to realize a method for manufacturing a multi-piece wiring substrate in which burrs and chipping in the corners of the wiring substrate 102 can be suppressed, easy division can satisfactorily be achieved, and the wiring substrate 102 with high dimensional precision can be manufactured.

Further, the first curved part 111 and the second curved part 112 can be formed in the corner of the wiring substrate 102. Thus, it is possible to provide a method for manufacturing a multi-piece wiring substrate that permits manufacturing of the wiring substrate 102 in which degradation in easy storability at the time of storing the wiring substrate 102 into a tray and chipping at the time of conveyance are suppressed. That is, in each corner of the manufactured wiring substrate 102, in a state where the individual dividing grooves have been formed (the matrix substrate 101 is not yet divided), as shown in FIGS. 2A and 2B, the first curved surface 115 is formed on the first principal face 103 side, and the second curved surface 118 is formed on the second principal face 104 side. Thus, it is possible to provide a method for manufacturing a multi-piece wiring substrate that permits efficient manufacturing, from the matrix substrate 101, of the wiring substrate 102 in which easy division can satisfactorily be achieved in a state where burrs and chipping are suppressed in the corner of the wiring substrate region, each corner is chamfered without the necessity of providing through holes in the outer periphery of the wiring substrate 102, and high dimensional precision is obtained.

Figure 7:
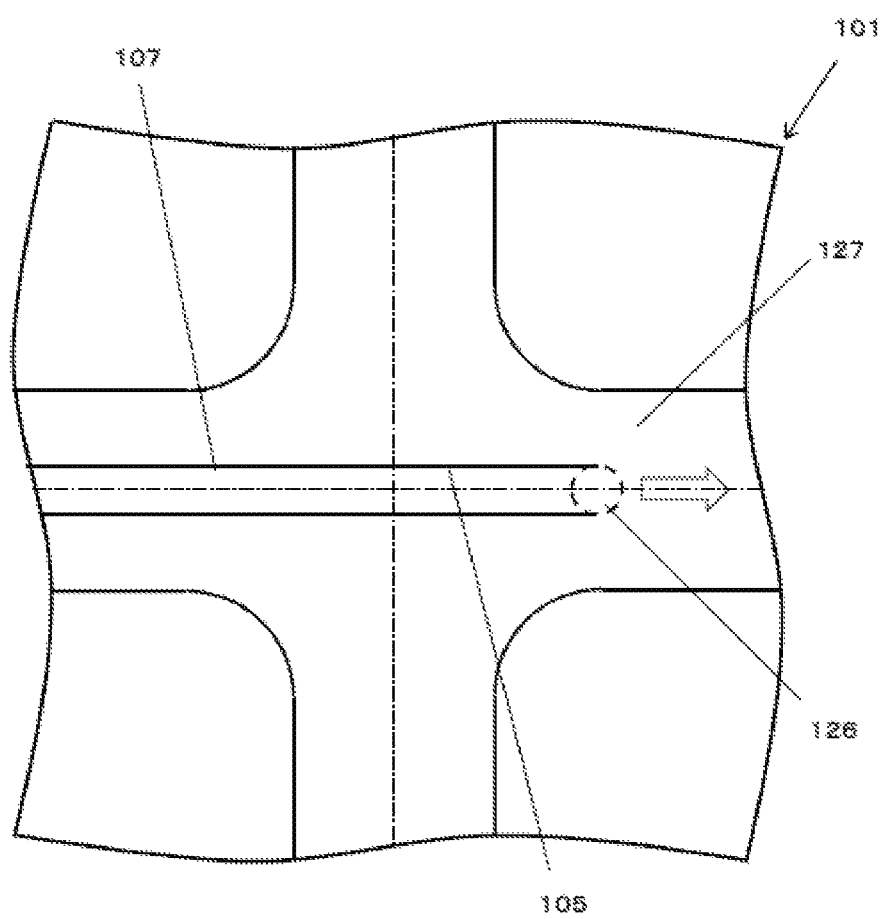
FIG. 7 is a main part enlarged view showing a method for manufacturing a multi-piece wiring substrate according to an embodiment of the invention.
Figure 8:
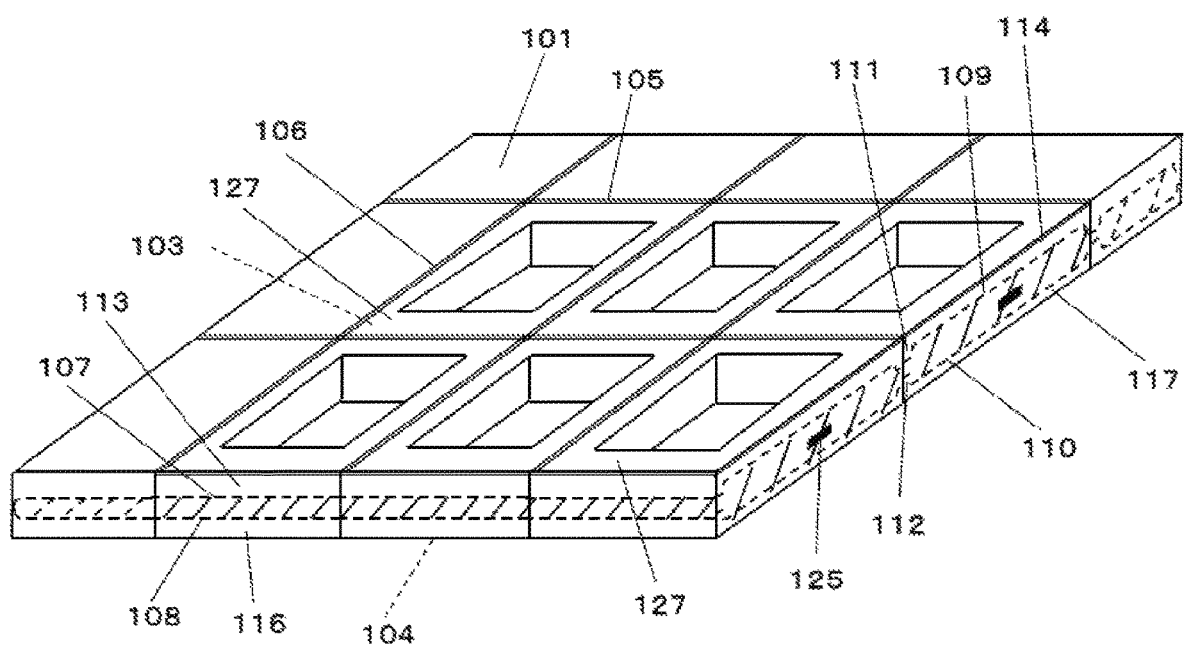
FIG. 8 is a main part enlarged view showing the method for manufacturing the multi-piece wiring substrate according to the embodiment of the invention.

The manufacturing method according to an embodiment of the invention is described below in detail. FIG. 7 is a main part enlarged view showing a method for manufacturing a multi-piece wiring substrate according to an embodiment of the invention. This figure shows a situation where the first dividing groove 107 is formed along the first side 105 on the first principal face 103 side of the matrix substrate 101 by using the laser beam 126. In order to provide the first curved part 111 and the first curved surface 115 in the four corners on the first principal face 103 side of the wiring substrate region constituting the wiring substrate 102 in the matrix substrate 101, for example, it is sufficient that the first dividing groove 107 is located along the first side 105 on the first principal face 103 side by using the laser beam 126 as shown in FIG. 7 and then, as shown in FIG. 8, the third dividing groove 109, a depth of which is smaller than a depth of the first dividing groove 107, is further provided so that the first dividing groove 107 and the third dividing groove 109 intersect with each other at the position of a corner of each wiring substrate region.

At the time of providing the third dividing groove 109, at the position of a corner of each wiring substrate region, the laser beam 126 is projected on the corner of each wiring substrate region. By virtue of this, the first curved part 111 is formed and the corner is chamfered by the laser beam 126 so that the first curved surface 115 is formed. The reason of this is as follows. The depth of the first dividing groove 107 is larger than the depth of the third dividing groove 109. Thus, in the corner of each wiring substrate region, the boundary between the matrix substrate 101 formed of a ceramic material and the atmosphere caused by the formation of the first dividing groove 107 is formed at both ends of the first dividing groove 107. Accordingly, the laser beam 126 is projected on this boundary at the time when the laser beam 126 for forming the third dividing groove 109 passes through the vicinity of this boundary, so that the first curved part 111 and the first curved surface 115 are formed. Then, as shown in FIGS. 2A and 2B, chamfering is performed by the laser beam 126 at the position of a corner of each wiring substrate region so that the first curved surface 115 is formed.

Further, in order to provide the second curved part 112 and the second curved surface 118 in the four corners on the second principal face 104 side of the wiring substrate region constituting the wiring substrate 102 in the matrix substrate 101, although not shown, similarly to the first principal face 103 side, it is sufficient that the second dividing groove 108 is located along the first side 105 on the second principal face 104 side by using the laser beam 126 and then the fourth dividing groove 110, a depth of which is smaller than a depth of the second dividing groove 108, is further provided so that the second dividing groove 108 and the fourth dividing groove 110 intersect with each other at the position of a corner of each wiring substrate region. By virtue of this, similarly to the first principal face 103 side, the second curved part 112 and the second curved surface 118 can be formed in the four corners on the second principal face 104 side of each wiring substrate region.

In the method for manufacturing the multi-piece wiring substrate according to the embodiment of the invention, the laser beam 126 is projected on the matrix substrate 101 substantially in a vertical direction from up to down and projected so that the focal point may be located in the vicinity of the lowest point of the dividing groove. That is, each dividing groove has a cross section of V-shape or U-shape. Thus, as shown in FIGS. 2A and 2B, the first curved surface 115 is formed so that the width increases as going closer to the first principal face 103 of the wiring substrate region, and the second curved surface 118 is formed so that the width increases as going closer to the second principal face 104 of the wiring substrate region. By virtue of this, in each wiring substrate 102 obtained by dividing the matrix substrate 101 into individual pieces, in both the first principal face 103 side (the upper surface) and the second principal face 104 side (the lower surface) of the wiring substrate 102, the corner in the vicinity of each principal face of the wiring substrate 102 is chamfered by the laser beam 126 and hence has a large curvature so that each corner of the wiring substrate 102 is less prone to constitute a sharp edge. Thus, at the time when the wiring substrate 102 is stored into a tray for conveyance or the like, each corner of the wiring substrate 102 is less prone to be caught on the inner side surface of the tray or the like even in a case where the tray is formed of a soft material. This more effectively improves the storability at the time of storing the wiring substrate 102 into the tray for conveying or the like. Further, generation of dusts can be suppressed that is caused when each corner of the wiring substrate 102 goes into contact with the inner side surface of the tray at the time of conveyance so that a part of the tray is scraped. Thus, it is possible to provide a method for manufacturing a multi-piece wiring substrate that permits manufacturing of the wiring substrate 102 in which degradation in easy storability at the time of storing the wiring substrate 102 into the tray and chipping at the time of conveyance are suppressed.

Further, the method for manufacturing the multi-piece wiring substrate according to the embodiment of the invention includes a step of forming the first bottom part 119 and the second bottom part 120 in such a manner that: in a transparent plan view, the first bottom part 119 formed in a region where the first dividing groove 107 and the third dividing groove 109 intersect with each other is located within the first imaginary circle 123 whose center is located in the first intersection part 121 where the second dividing groove 108 and the fourth dividing groove 110 intersect with each other and whose radius is equal to a length between the first intersection part 121 and one end part of the second curved part 112 where the depth of the fourth dividing groove 110 is smallest; and that in a transparent plan view, the second bottom part 120 formed in a region where the second dividing groove 108 and the fourth dividing groove 110 intersect with each other is located within the second imaginary circle 124 whose center is located in the second intersection part 122 where the first dividing groove 107 and the third dividing groove 109 intersect with each other and whose radius is equal to a length between the second intersection part 122 and the first curved part 111 where the depth of the third dividing groove 109 is smallest.

By virtue of this manufacturing method, at the time when the matrix substrate 101 is divided into individual pieces so that the wiring substrate 102 is manufactured, it is possible to provide a multi-piece wiring substrate in which burrs and chipping easily caused in each corner of the wiring substrate 102 by positional deviation between the dividing grooves in the upper and the lower surface can be suppressed effectively. Specifically, when the matrix substrate 101 is bent along the first side 105 from the first dividing groove 107 located on the first principal face 103 side toward the second dividing groove 108 located on the second principal face 104 side so as to be opposite to the first dividing groove 107 so that the matrix substrate 101 is divided, a fracture part is generated along the first side 105 from the bottom part of the first dividing groove 107 toward the bottom part of the second dividing groove 108. Further, in each corner of the wiring substrate region, a fracture part is generated from the first bottom part 119 which is positioned deeper than the bottom part of the first dividing groove 107 toward the second bottom part 120 which is positioned deeper than the bottom part of the second dividing groove 108. At that time, the surfaces of the first bottom part 119 and the second bottom part 120 have curved surfaces along the first curved part 111 and the second curved part 112. Thus, even when positional deviation occurs between the dividing grooves in the upper and the lower surface, these curved surfaces have an effect of alleviating the positional deviation between the dividing grooves. Accordingly, it is possible to provide a method for manufacturing a multi-piece wiring substrate in which burrs and chipping easily caused in each corner of the wiring substrate 102 by positional deviation between the dividing grooves in the upper and the lower surface are effectively suppressed.

Here, in the embodiments given above, there has been employed a method in which the matrix substrate 101 is bent along the first side 105 from the first dividing groove 107 located on the first principal face 103 side toward the second dividing groove 108 located on the second principal face 104 side so as to be opposite to the first dividing groove 107 so that the matrix substrate 101 is divided. On the contrary, the matrix substrate 101 may be bent along the first side 105 from the second dividing groove 108 located on the second principal face 104 side toward the first dividing groove 107 located on the first principal face 103 side so that the matrix substrate 101 may be divided. Further, the matrix substrate 101 may be bent along the second side 106 from the third dividing groove 109 located on the first principal face 103 side toward the fourth dividing groove 110 located on the second principal face 104 side so as to be opposite to the third dividing groove 109 so that the matrix substrate 101 may be divided. On the contrary, the matrix substrate 101 may be bent along the second side 106 from the fourth dividing groove 110 located on the second principal face 104 side toward the third dividing groove 109 located on the first principal face 103 side so that the matrix substrate 101 may be divided. The division method may be changed suitably depending on the shapes of the matrix substrate 101 and the wiring substrate 102 and the depth of each dividing groove.

Here, as shown in FIGS. 1A and 1B, in a case where the wiring conductor 125 for connection is formed in the inner layer of the second side 106 of the wiring substrate region, even when the size of the wiring substrate 102 is reduced so that the thickness becomes extremely thin, when the third dividing groove 109 arranged in the first principal face 103 of the second side 106 and the fourth dividing groove 110 arranged in the second principal face 104 are formed in a relatively shallow depth, it is possible to suppress wire breakage in the wiring conductor 125 for connection caused by the formation of the dividing grooves. Thus, it is possible to provide a method for manufacturing a multi-piece wiring substrate in which wire breakage in the wiring conductor 125 for connection which is to be a conduction path between adjacent wiring substrate regions is suppressed and erroneous division of the matrix substrate 101 caused by a stress at the time of handling or the like is suppressed. As for a procedure of dividing the matrix substrate 101 into individual pieces, first, the matrix substrate 101 may be divided along each first side 105 in which the first dividing groove 107 and the second dividing groove 108 are formed, into the form of strips, that is, into arrays in each of which the wiring substrate regions are arranged in line. Then, each strip-shaped array may be divided into individual pieces of the wiring substrates 102 along each of the second sides 106 in which the third dividing groove 109 and the fourth dividing groove 110 are formed. By virtue of this dividing method, in division of the matrix substrate 101 along the first side 105, the depth of each dividing groove becomes relatively deep but the fracture area in the entire matrix substrate 101 can be made large. Further, in division of the strip-shaped array along the second side 106, the depth of each dividing groove becomes relatively shallow but the width of the array to be divided can be reduced. Thus, the fracture area can be reduced. Accordingly, in a state where easy division of the matrix substrate 101 can satisfactorily be achieved, there are effects that erroneous division caused by a stress at the time of handling or the like can be suppressed and that, further, wire breakage in the wiring conductor 125 for connection can be suppressed.

Here, the types of laser employable in the method for manufacturing the multi-piece wiring substrate according to the embodiments of the invention include a UV laser, a green laser, and an IR laser. The output per unit area of the laser beam (the unit area of the surface of the workpiece in the portion on which the laser beam is projected) at the time of laser processing is relatively small and hence the generation rate of fused materials is low. In this case, in comparison with the matrix substrate 101 after sintering, removal of fused materials generated by laser processing is easier in the not-yet-fired ceramic green sheet stacked body constituting the matrix substrate 101 in which organic substances such as the binder are contained. Thus, even a laser beam of relatively low energy as described above can form the first curved part 111, the second curved part 112, the first curved surface 115, and the second curved surface 118 into satisfactory shapes. This makes it possible to provide a method for manufacturing a multi-piece wiring substrate permitting manufacturing of the wiring substrate 102 in which even when positional deviation occurs between the dividing grooves in the upper and the lower surface, these curved parts and curved surfaces have an effect of alleviating the positional deviation between the dividing grooves so that burrs and chipping caused by the positional deviation between the dividing grooves in the upper and the lower surface are effectively suppressed.

Here, in the matrix substrate 101, dummy regions may be provided so as to surround the plurality of wiring substrate regions arranged in longitudinal and transverse directions. Then, dividing grooves similar to those of the above-mentioned wiring substrate regions may be provided. In this case, dividing grooves arranged in the dummy region and along the boundary between the dummy region and the wiring substrate region are formed simultaneously to the above-mentioned step for the dividing grooves of the wiring substrate region.

Further, the multi-piece wiring substrate, the wiring substrate, and the method for manufacturing the wiring substrate according to the embodiments of the invention are not limited to the examples in the embodiments given above, and various changes may be made without departing from the scope of the invention. For example, in the examples in the embodiments given above, the wiring substrate 102 having a rectangular shape has been employed. Instead, the matrix substrate 101 in which wiring substrate regions each constituting the wiring substrate 102 having a square shape are provided, may be employed. Further, the wiring substrate 102 has been configured so that a recess-shaped mounting section for housing an electronic component is formed. Instead, the matrix substrate 101 in which flat-plate shaped wiring substrate regions each having a mounting section not provided with a recess-shaped mounting section are provided, may be employed.

What is claimed is:

1. A wiring substrate, comprising:
a substrate comprising a first principal face and a second principal face opposite to the first principal face and having a rectangular shape in a plan view thereof; and
a wiring conductor,
the first principal face comprising a first corner, a first side, and a second side, the first corner being located between the first side and the second side in a plan view of the first principal face,
the second principal face comprising a second corner which is located at a position corresponding to the first corner, a third side which is located at a position corresponding to the first side, and a fourth side which is located at a position corresponding to the second side, in a plan view of the second principal face,
the substrate comprising a first side surface which is connected to the first side, a second side surface which is connected to the second side, a third side surface which is connected to the third side, a fourth side surface which is connected to the fourth side, a first fracture part which is located between the first side surface and the third side surface to connect the first side surface and the third side surface, and a second fracture part which is located between the second side surface and the fourth side surface to connect the second side surface and the fourth side surface,
in a thickness direction of the substrate, a length of the second side surface being smaller than a length of the first side surface,
the second side surface comprising a first curved part on a side close to the first corner, the first curved part being convexly curved toward the second corner and the second principal face.

2. The wiring substrate according to claim 1, further comprising:
a first curved surface which is located between the first side surface and the second side surface in a region close to the first principal face,
wherein the first curved surface has a width gradually decreasing as going toward a center part of the substrate in the thickness direction thereof.

3. The wiring substrate according to claim 2, wherein
in a thickness direction of the substrate, a length of the fourth side surface is smaller than a length of the third side surface, and
the fourth side surface comprises a second curved part on a side close to the second corner, and the second curved part is convexly curved toward the first corner and the first principal face.

4. The wiring substrate according to claim 3, further comprising:
a second curved surface which is located between the third side surface and the fourth side surface in a region close to the second principal face,
wherein the second curved surface has a width gradually decreasing as going toward a center part of the substrate in the thickness direction thereof.

5. The wiring substrate according to claim 1, wherein
in a thickness direction of the substrate, a length of the fourth side surface is smaller than a length of the third side surface, and
the fourth side surface comprises a second curved part on a side close to the second corner, and the second curved part is convexly curved toward the first corner and the first principal face.

6. The wiring substrate according to claim 5, further comprising:
a second curved surface which is located between the third side surface and the fourth side surface in a region close to the second principal face,
wherein the second curved surface has a width gradually decreasing as going toward a center part of the substrate in the thickness direction thereof.

* * * * *